(12) United States Patent
Nakamura et al.

(10) Patent No.: US 10,420,256 B1
(45) Date of Patent: Sep. 17, 2019

(54) POWER CONVERTER

(71) Applicant: Keihin Corporation, Tokyo (JP)

(72) Inventors: Kazuki Nakamura, Tochigi (JP);
Morifumi Shigemasa, Tochigi (JP);
Shinichiro Hayakawa, Tochigi (JP);
Kenichi Sasaki, Tochigi (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 16/228,275

(22) Filed: Dec. 20, 2018

(30) Foreign Application Priority Data

Mar. 19, 2018 (JP) ................. 2017-051492

(51) Int. Cl.
*H05K 7/20* (2006.01)
*H05K 5/06* (2006.01)
*H05K 5/00* (2006.01)

(52) U.S. Cl.
CPC ......... *H05K 7/20927* (2013.01); *H05K 5/061* (2013.01); *H05K 7/20254* (2013.01); *H05K 7/20272* (2013.01); *H05K 5/0008* (2013.01)

(58) Field of Classification Search
None
See application file for complete search history.

(56) References Cited

U.S. PATENT DOCUMENTS

| | | | | |
|---|---|---|---|---|
| 6,434,003 B1* | 8/2002 | Roy | ................ | H05K 7/20927 165/104.22 |
| 7,876,561 B2* | 1/2011 | Schnetzka | ............ | F25B 49/025 180/297 |
| 9,894,812 B2* | 2/2018 | Sakamoto | ............. | B60K 6/405 |
| 9,980,415 B2* | 5/2018 | Zhou | ................. | H05K 7/20927 |
| 10,186,470 B2* | 1/2019 | Abeyasekera | ...... | H01L 23/3735 |
| 2012/0001341 A1* | 1/2012 | Ide | ........................ | H01L 23/473 257/773 |
| 2017/0067589 A1* | 3/2017 | Ishikawa | ................... | F28F 3/12 |

FOREIGN PATENT DOCUMENTS

JP 2016-067096 4/2016

OTHER PUBLICATIONS

Japanese Office Action (Notification of Reasons for Refusal) with English translation dated Oct. 23, 2018, 2 pages.
Japanese Decision to Grant a Patent dated Dec. 7, 2018 with English translation includes Certificate of U.S. Pat. No. 6,457,678, 8 pages.

* cited by examiner

*Primary Examiner* — Courtney L Smith
(74) *Attorney, Agent, or Firm* — Rankin, Hill & Clark LLP (57) ABSTRACT

A power converter includes a sealing member in a loop shape sealing a space between a sealing surface of a cooler and a sealing surface of a casing. Either one of the sealing surface of the cooler and the sealing surface of the casing is provided with a groove in a loop shape enabling the sealing member to be fitted therein. A first positioning portion is provided on a bottom surface of the groove. The sealing member includes an internal sealing portion with a circular cross-section and located along the bottom surface of the groove, an external sealing portion with a circular cross-section and located so as to surround a looped outer circumference surface of the internal sealing portion, and a connected portion that connects the internal sealing portion to the external sealing portion across an entire circumference of the loop. The connected portion includes a second positioning portion capable of being fitted in the first positioning portion.

6 Claims, 4 Drawing Sheets

POWER CONVERTER

FIELD OF THE INVENTION

The present disclosure relates to an improvement technology for a power converter.

BACKGROUND

A power converter is, for example, installed between a battery and a motor, controls power stored in the battery, and supplies the controlled power to the motor. A power converter loaded on a hybrid vehicle or an electric vehicle, i.e., a large number of sub units (e.g., power modules) which forms a power control unit (PCU) generates heat, and there is a possibility such that the performance decreases due to the adverse effect of generated heat, and thus a cooling mechanism is necessary. Various cooling technologies have been proposed (see, for example, JP 2016-067096 A).

A power converter disclosed in JP 2016-067096 A includes a cooler on a casing. This cooler includes a fluid inlet in which a cooling fluid is introduced, and a fluid outlet from which the cooling fluid is discharged. The cooling fluid is circulated via a plurality of connection paths respectively connected to the fluid inlet and the fluid outlet. The connection portion between the fluid inlet and the connection path, and the connection portion between the fluid outlet and the connection path are sealed by respective sealers.

Each sealer includes a first sealing member in a loop shape which prevents the cooling fluid from being leaked to the exterior from the connection portion, a second sealing member in a loop shape that surrounds the first sealing member, and a drain passage provided between the first sealing member and the second sealing member. This drain passage is formed in the casing. The cooling fluid trapped between the first sealing member and the second sealing member is discharged to the exterior of the casing from a drain discharging port via the drain passage. Formed in the sealing surface of the casing are a first groove in a loop shape in which the first sealing member can be fit, and a second groove in a loop shape in which the second sealing member can be fit.

Patent Literature Document 1: Japanese Patent Application Laid-Open Publication No. 2016-067096.

According to the sealing structure disclosed in JP 2016-067096 A, it is necessary to form both the first groove and the second groove in the sealing surface of the casing. The space between the first groove and the second groove is partitioned by a certain width. That is, a partition wall is provided between the first groove and the second groove. Since the diameter of the second groove increases by what corresponds to the partition wall, it is necessary for the sealing surface to have a large sealing space. Consequently, since the sealing surface becomes large, the casing and the cooler increase the respective sizes. This is disadvantageous to attempt downsizing of the power converter. In particular, when the complicated loop shape and the sealing members that are large respectively are employed, simply fitting each sealing member in each groove is disadvantageous in view of the assemble easiness, and thus there is a leeway for improvement.

An objective of the present disclosure is to provide a technology capable of improving the assemble easiness of a sealing member while achieving downsizing of a power converter.

SUMMARY OF THE INVENTION

A power converter according to an embodiment of the present disclosure comprises:

a cooler that cools down an electronic component;
a casing comprising the cooler; and
a sealing member in a loop shape sealing a space between a sealing surface of the cooler and a sealing surface of the casing, wherein:

either one of the sealing surface of the cooler and the sealing surface of the casing is provided with a groove in a loop shape enabling the sealing member to be fitted therein;

a first positioning portion is provided on a bottom surface of the groove;

the sealing member comprises an internal sealing portion with a circular cross-section and located along the bottom surface of the groove, an external sealing portion with a circular cross-section and located so as to surround a looped outer circumference surface of the internal sealing portion, and a connected portion that connects the internal sealing portion to the external sealing portion across an entire circumference of the loop; and the connected portion comprises a second positioning portion capable of being fitted in the first positioning portion.

According to an embodiment of the present disclosure, both surfaces of the connected portion are recessed backwardly relative to the respective sealing surfaces of the internal sealing portion and the external sealing portion; and a space surrounded by the internal sealing portion, the external sealing portion, and the connected portion forms a drain passage enabling a leaked cooling medium from the internal sealing portion to pass therethrough.

According to an embodiment of the present disclosure, the first positioning portion comprises a protrusion protruding from the bottom surface of the groove toward an opening of the groove; the protrusion has a drain hole capable of discharging the cooling medium trapped in the drain passage to an exterior of the casing; and the second positioning portion is a through-hole enabling the protrusion to be fitted therein.

According to an embodiment of the present disclosure, the electronic component comprises a power module, and other electronic components that have a little amount of heat generation than the power module; the cooler comprises a first cooling unit that cools down the power module and a second cooling unit that cools down the other electronic components; a drain guide path runs through an interior of the casing, the drain guide path guiding a leaked cooling medium from between the first cooling unit and the casing; the sealing member comprises a second cooling unit sealing member that seals a space between a sealing surface of the second cooling unit and a sealing surface of the casing; the groove comprises a second cooling unit groove enabling the second cooling unit sealing member to be fitted therein; the first positioning portion comprises a protrusion protruding from a bottom surface of the second cooling unit groove toward an opening of the groove; the protrusion has a drain hole enabling the cooling medium guided from the drain guide path to flow in the drain passage of the second cooling unit sealing member; and the second positioning portion is a through-hole enabling the protrusion to be fitted therein.

According to an embodiment of the present disclosure, the sealing member in the loop shape comprises an extended portion extended outwardly from an outer circumference surface of the loop or an inner circumference surface thereof; and either one of the cooler and the casing has a recess enabling the extended portion to be fitted therein.

According to an embodiment of the present disclosure, at least a part of the cooler is integrally formed with the casing.

According to an embodiment of the present disclosure, the sealing member integrally connects the internal sealing portion that has a circular cross-section to the external sealing portion that has a circular cross-section across the entire circumference of a loop by the connected portion. That is, the sealing member is a single member. This single sealing member can be fitted in the single groove in a loop shape. Hence, unlike conventional technologies, it is unnecessary to provide a plurality of grooves in the sealing surface of the cooler and in the sealing surface of the casing. This simply requires a relatively small sealing space for the sealing surface, enabling downsizing of the casing and of the cooler. Consequently, downsizing of the power converter is achievable.

Moreover, the first positioning portion is provided on the bottom surface of the groove, and the second positioning portion is provided on the connected portion. Fitting of the second positioning portion in the first positioning portion facilitates positioning of the sealing member relative to the groove. Accordingly, assemble easiness of the sealing member relative to the groove is improved, reducing the number of steps of assembling. This is particularly advantageous when a sealing member in a complex loop shape and a large sealing member are adopted.

In addition, the internal sealing member and the external sealing member both have the circular cross-section, an inclination and a fall-down do not occur when the respective sealing surfaces are butted with each other and compressed against each other. This ensures a stable sealing performance by the sealing member.

According to an embodiment of the present disclosure, the space surrounded by the internal sealing portion, the external sealing portion, and the connected portion is utilized as a drain passage. Hence, it is unnecessary to provide additional drain passage in the sealing surface of the cooler and in the sealing surface of the casing. This enables further downsizing of the casing and of the cooler. Moreover, a component to provide an additional drain passage is unnecessary, achieving cost reduction.

According to an embodiment of the present disclosure, the first positioning portion that is a protrusion protruding from the bottom surface of the groove and the second positioning portion that is a through-hole in which the protrusion can be fitted facilitate positioning of the sealing member relative to the groove. Moreover, the protrusion is provided with a drain hole capable of discharging the trapped cooling medium in the drain passage to the exterior of the casing. That is, by providing the drain hole in the protrusion, an additional drain hole is unnecessary. Consequently, the power converter can be downsized, while at the same time, costs for the power converter can be reduced.

According to an embodiment of the present disclosure, the first positioning portion that is a protrusion protruding from the bottom surface of the groove for the second cooling unit and the second positioning portion that is a through hole in which the protrusion can be fitted facilitate positioning of the sealing member for the second cooling unit relative to the groove for the second cooling unit. Moreover, further provided is a drain hole that causes a drain guide path which guides the leaked cooling medium between the first cooling unit and the casing to be in communication with a drain passage for the second cooling unit. This drain hole is provided in the protrusion. That is, by providing the drain hole in the protrusion, an additional drain hole is unnecessary. Consequently, the power converter can be downsized, while at the same time, costs for the power converter can be reduced.

According to an embodiment of the present disclosure, by combining the extended portion of the sealing member with the recess in which this extended portion can be fitted, the fitting direction of the sealing member relative to the groove is defined. This prevents a so-called false assembling such that the sealing member is fitted in the groove with an improper fitting direction. Accordingly, the assemble easiness of the sealing member relative to the groove is improved. Moreover, this enables further precise positioning of the sealing member relative to the groove.

According to an embodiment of the present disclosure, at least a part of the cooler is integrally formed with the casing. That is, by utilizing the space in the casing, the casing serves at least a part of the cooler. This simplifies the structure of the power converter, and achieves further downsizing of the power converter.

DETAILED DESCRIPTION OF THE EMBODIMENTS

An embodiment to carry out the present disclosure will be described below with reference to the accompanying drawings.

Figure 1A:
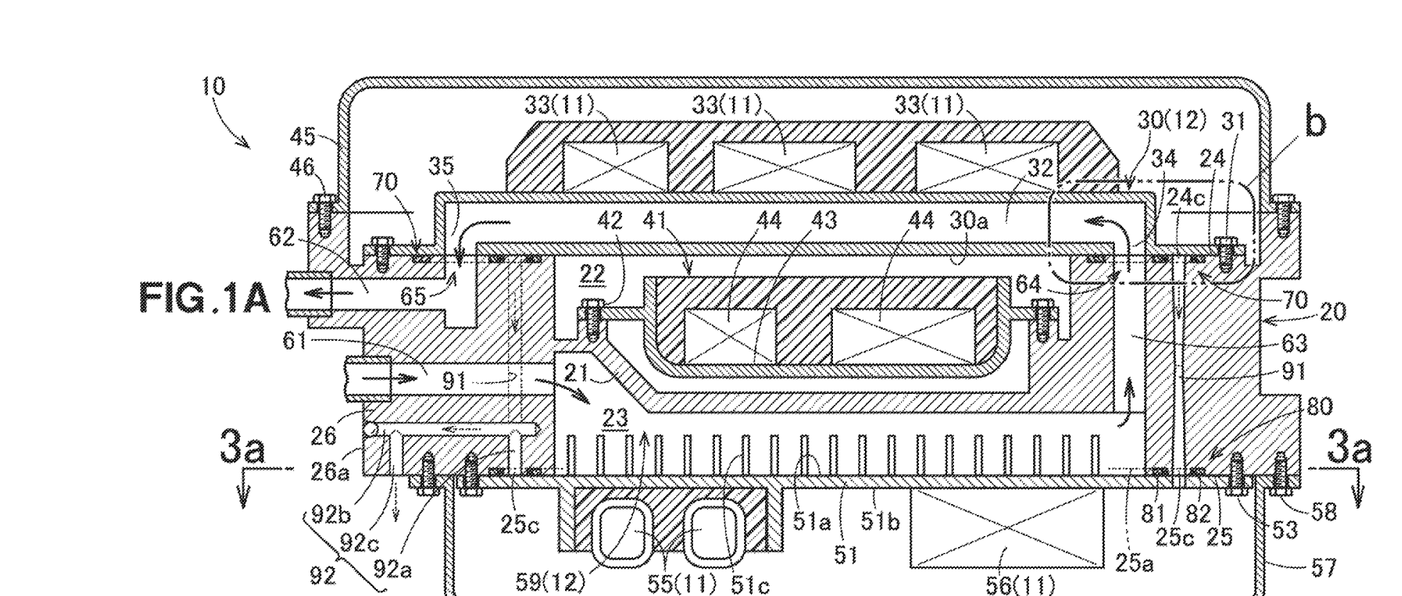
FIGS. 1A to 1D are each an exemplarily diagram illustrating a cross-section of a power converter according to the present disclosure and a structure of the major portion thereof.

FIG. 1A illustrates an exemplarily cross-section of a power converter 10.

Figures 1B, 1C:
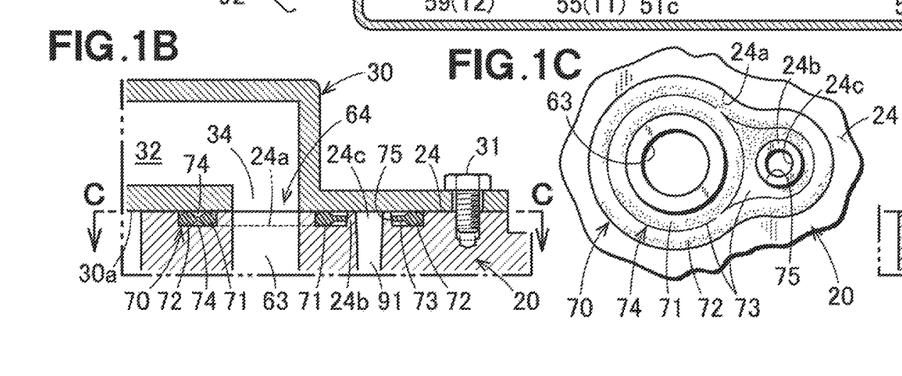

FIG. 1B illustrates a portion b in FIG. 1A in an enlarged manner.

FIG. 1C illustrates a cross-sectional structure along a line c-c in FIG. 1B.

Figure 1D:
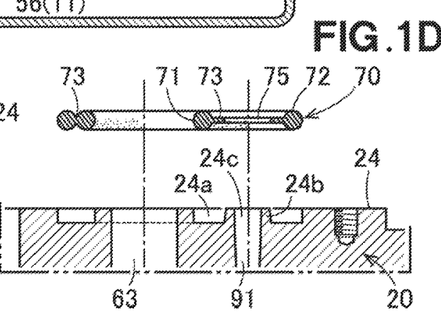

FIG. 1D illustrates a structure around a first sealing member 70 illustrated in FIG. 1B in an exploded manner.

Figure 2A:
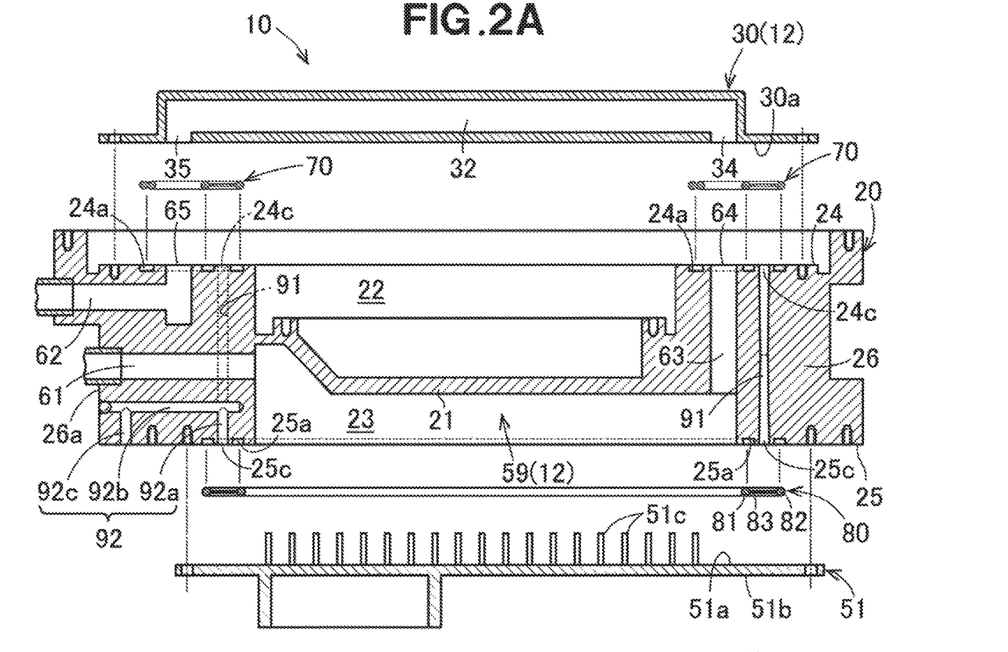
FIGS. 2A and 2B are an exploded view of the power converter illustrated in FIG. 1 and a perspective view around a plurality of sealers.

FIG. 2A illustrates the power converter 10 illustrated in FIG. 1A in an exploded manner.

Figure 2B:
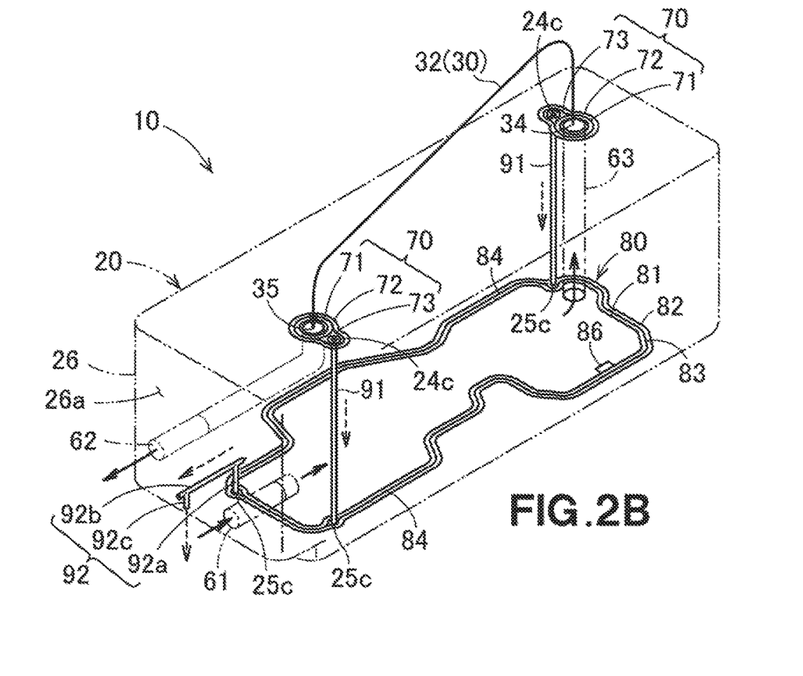

FIG. 2B is a perspective view around a plurality of sealing members 70, 70, and 80 illustrated in FIG. 1A.

First, an electronic component 11 and a cooler 12 which are applied to a power converter 10 illustrated in FIG. 1A will be defined as follows. The electronic component 11 includes a "power module 33" and "other electronic components 55 and 56" that have a smaller amount of heat generation than that of this power module 33. The power module 33 is a kind of high-heat-generating electronic component which has a large amount of heat generation through an operation and which needs a passive heat dissipation. The other electronic components 55 and 56 are, for example, a smoothing capacitor, a reactor, a DC-DC converter, and a discharging resistor. In order to facilitate understanding, the one electronic component 55 in the other electronic components 55 and 56 will be referred to as a "first electronic component 55", and the other electronic component 56 will be referred to as a "second electronic component 56". The cooler 12 includes a first cooling unit 30 that cools down the power module 33, and a second cooling unit 59 that cools down the other electronic components 55 and 56.

The power converter 10 will be described below in detail. The power converter 10 includes a casing 20. This casing 20 is formed in a substantially rectangular shape in a planar view, and includes the first cooling unit 30 and the second cooling unit 59.

As illustrated in FIGS. 1A and 2A, the casing 20 is divided into a first space 22 and a second space 23 by an integrally formed dividing plate 21. For example, the first space 22 is located right above the second space 23.

The first space 22 has an opened opposite side (upper side) to the dividing plate 21. Formed in the casing 20 along the edge of the opened end of the first space 22 is a flat seat 24. This seat 24 will be referred to as a "sealing surface 24 of the casing 20" as appropriate below. A sealing surface 30a of the first cooling unit 30 is attached to this sealing surface 24. More specifically, the first cooling unit 30 is a separate component from the casing 20 and is a substantially flat cooling medium jacket, and is freely detachably attached to the first space 22 by bolts 31. That is, the first cooling unit 30 is attached to the casing 20 while blocking the opened end (opened surface) of the first space 22. This first cooling unit 30 has a cooling medium passage 32 provided thereinside. The power module 33 is mounted on the external surface of the first cooling unit 30.

The first space 22 holds therein a sub unit 41. This sub unit 41 includes a board 43 that is freely detachable attached to the dividing plate 21 by bolts 42, and a third electronic component 44 mounted on this board 43. This third electronic component 44 is an electronic component which has smaller amount of heat generation than that of the above-described power module 33, such as a smoothing capacitor, a reactor, a DC-DC converter, or a discharging resistor. The first cooling unit 30 and the power module 33 are covered by a first cover 45. This first cover 45 is freely detachably attached to the casing 20 by bolts 46.

The second space 23 is defined by a groove that opens the opposite side (lower side) to the dividing plate 21. Formed in the casing 20 along the edge of the opened end of the second space 23 is a flat seat 25. This seat 25 will be referred to as a "sealing surface 25 of the casing 20" as appropriate below. A lid 51 is attached to this sealing surface 25. That is, the second space 23 has the opened end at the opposite side to the dividing wall 21 blocked by the lid 51. Thus, the lid 51 is attached to the casing 20 while blocking the opened end (opened surface) of the second space 23.

More specifically, the lid 51 is a flat plate which is laid over on the seat 25 (sealing surface 25) of the second space 23 and which is freely detachably attached thereto by bolts 53. The surface of the lid 51 which is laid over on the seat 25 (sealing surface 25) of the second space 23 will be referred to as a sealing surface 51a, and the opposite side to this sealing surface 51a will be referred to as a mount surface 51b. A plurality of cooling fins 51c that extends toward the interior of the second space 23 is formed on the sealing surface 51a. The other electronic components 55 and 56 are mounted on the mount surface 51b.

The lid 51 and the other electronic components 55 and 56 are covered by a second cover 57. The second cover 57 is freely detachably attached to the casing 20 by bolts 58.

The second cooling unit 59 is a cooling medium jacket formed by a wall portion (including the dividing plate 21) which forms the second space 23, and the lid 51 that blocks the second space 23. Thus, at least a part of the second cooling unit 59 is integrally formed with the casing 20. The second space 23 will be also referred to as a "cooling medium passage 23" as appropriate below. The sealing surface 51a of the lid 51 will be also referred to as a "sealing surface 51a of the second cooling unit 59".

Furthermore, the casing 20 includes a plurality of connected cooling medium paths 61 to 63 provided thereinside. More specifically, the casing 20 holds therein a first connected cooling medium path 61 (a cooling medium inlet 61, a first cooling medium port 61) that introduces a cooling medium from the exterior to the casing 20, a second connected cooling medium path 62 (a cooling medium outlet 62, a second cooling medium port 62) that discharges the cooling medium from the casing 20 to the exterior, and a third connected cooling medium path 63 that connects the first cooling unit 30 to the second cooling unit 59. One end of the second connected cooling medium path 62 and one end of the third connected cooling medium path 63 are opened to the sealing surface 24 of the casing 20.

The first connected cooling medium path 61 and the second connected cooling medium path 62 are formed on the same surface 26a of a side wall 26 of the casing 20, and are located at the opposite side to the third connected cooling medium path 63.

The first cooling unit 30 includes the cooling medium port 34 (a cooling medium introducing port 34) that introduces the cooling medium from the third connected cooling medium path 63, and a cooling medium port 35 (a cooling medium discharging port 35) that discharges the cooling medium to the second connected cooling medium path 62. The cooling medium introducing port 34 and the cooling medium discharging port 35 are in communication with the cooling medium passage 32 of the first cooling unit 30. A first connection portion 64 between the cooling medium introducing port 34 of the first cooling unit 30 and the third connected cooling medium path 63, and a second connection portion 65 between the cooling medium discharging port 35 of the first cooling unit 30 and the second connected cooling medium path 62 are both the seat 24 of the first space 22.

As illustrated in FIG. 1A, the cooling medium (e.g., cooling water) supplied from the first connected cooling medium path 61 passes through a route that includes the second cooling unit 59, the third connected cooling medium path 63, and the first cooling unit 30, and is discharged from the second connected cooling medium path 62. The cooling medium that flows through the cooling medium passage 32 directly cools down the power module 33 via the first cooling unit 30. The cooling medium that flows through the second cooling unit 59 directly cools down the other electronic components 55 and 56 via the plurality of cooling fins 51c and the lid 51. Hence, the power module 33 and the other electronic components 55 and 56 can be directly and efficiently cooled down.

The first connection portion 64 and the second connection portion 65 are respectively sealed by first sealing members 70 and 70 each in a loop shape. The description will be given to the first sealing member 70 that seals the first connection portion 64 as a representative example with reference to FIGS. 1A to 1D.

The sealing surface 24 of the casing 20 has a groove 24a in a loop shape that surrounds the opening of the third connected cooling medium path 63. The first sealing member 70 can be fitted in this groove 24a. A first positioning portion 24b is provided on a bottom surface of this groove 24a.

The first sealing member 70 is formed of an elastic material like a rubber, and seals a space between the sealing surface 24 of the casing 20 and the sealing surfaces 30a of the first cooling unit 30. More specifically, the first sealing member 70 is an integral mold component that includes an internal sealing portion 71, an external sealing portion 72, and a connected portion 73.

The internal sealing portion 71 is in a loop shape along the bottom surface of the groove 24a and the inner circumference surface thereof, and has a circular cross-section (e.g., a true-circle cross-section).

The external sealing portion 72 is in a loop shape located along the bottom surface of the groove 24a while surrounding the looped outer circumference surface of the internal sealing portion 71, and has a circular cross-section (e.g., true-circle cross-section). That is, this external sealing portion 72 adjoins to the looped outer circumference surface of the internal sealing portion 71. The diameter of the circular cross-section of the external sealing portion 72 is consistent with that of the circular cross-section of the internal sealing portion 71.

The connected portion 73 integrally connects the looped outer circumference surface of the internal sealing portion 71 with the looped inner circumference surface of the external sealing portion 72 across the entire circumference of the loop. That is, the connected portion 73 is an integrated portion between the looped outer circumference surface of the internal sealing portion 71 that has a circular cross-section and the looped outer circumference surface of the external sealing portion 72 that has a circular cross-section.

Both surfaces of the connected portion 73 are recessed backwardly relative to the respective sealing surfaces of the internal sealing portion 71 and external sealing portion 72. That is, since the looped outer circumference surface of the internal sealing portion 71 that has a circular cross-section and the looped outer circumference surface of the external sealing portion 72 that has a circular cross-section are integrated with each other, a recess 74 (a space 74) is formed in the boundary portion between these sealing portions 71 and 72. Thus, the space 74 surrounded by the internal sealing portion 71, the external sealing portion 72, and the connected portions 73 forms a drain passage through which the leaked cooling medium from the internal sealing portion 71 can pass. This space 74 will be referred to as a "drain passage 74" below.

The connected portion 73 includes a second positioning portion 75 which can be fitted with the first positioning portion 24b.

The first positioning portion 24b of the groove 24a is formed by a protrusion that protrudes from the bottom surface of the groove 24a toward the groove opening. The first positioning portion 24b will be also referred to as a "protrusion 24b" as appropriate below. This protrusion 24b has a drain hole 24c capable of discharging the trapped cooling medium in the drain passage 74 to the exterior of the casing 20.

This protrusion 24b and the drain hole 24c are located at the center of the groove 24a in the widthwise direction so as to correspond to the location of the drain passage 74. The groove width of the portion of the groove 24a where the protrusion 24b and the drain passage 74 are located is larger than the groove widths of other portions.

Conversely, the clearance between the internal sealing portion 71 and the external sealing portion 72 is wide at the portion of the first sealing member 70 corresponding to the above-described protrusion 24b. Hence, the width of the connected portion 73 is also wide. The second positioning portion 75 is a through-hole which is located at the wide portion of the connected portion 73 and in which the protrusion 24b can be fitted. This second positioning portion 75 will be also referred to as a "through-hole 75" as appropriate below.

As illustrated in FIG. 1A, a space between the sealing surface 25 of the casing 20 and the sealing surface 51a of the lid 51 (the sealing surface 51a of the second cooling unit 59) is sealed by a second sealing member 80. This second sealing member 80 will be also referred to as a "second cooling unit sealing member 80" as appropriate below. The second sealing member 80 will be described with reference to FIGS. 1A, 2A and 2B, and 3A to 3G.

Figures 3A, 3B, 3C, 3D, 3E, 3F, 3G, 3H:
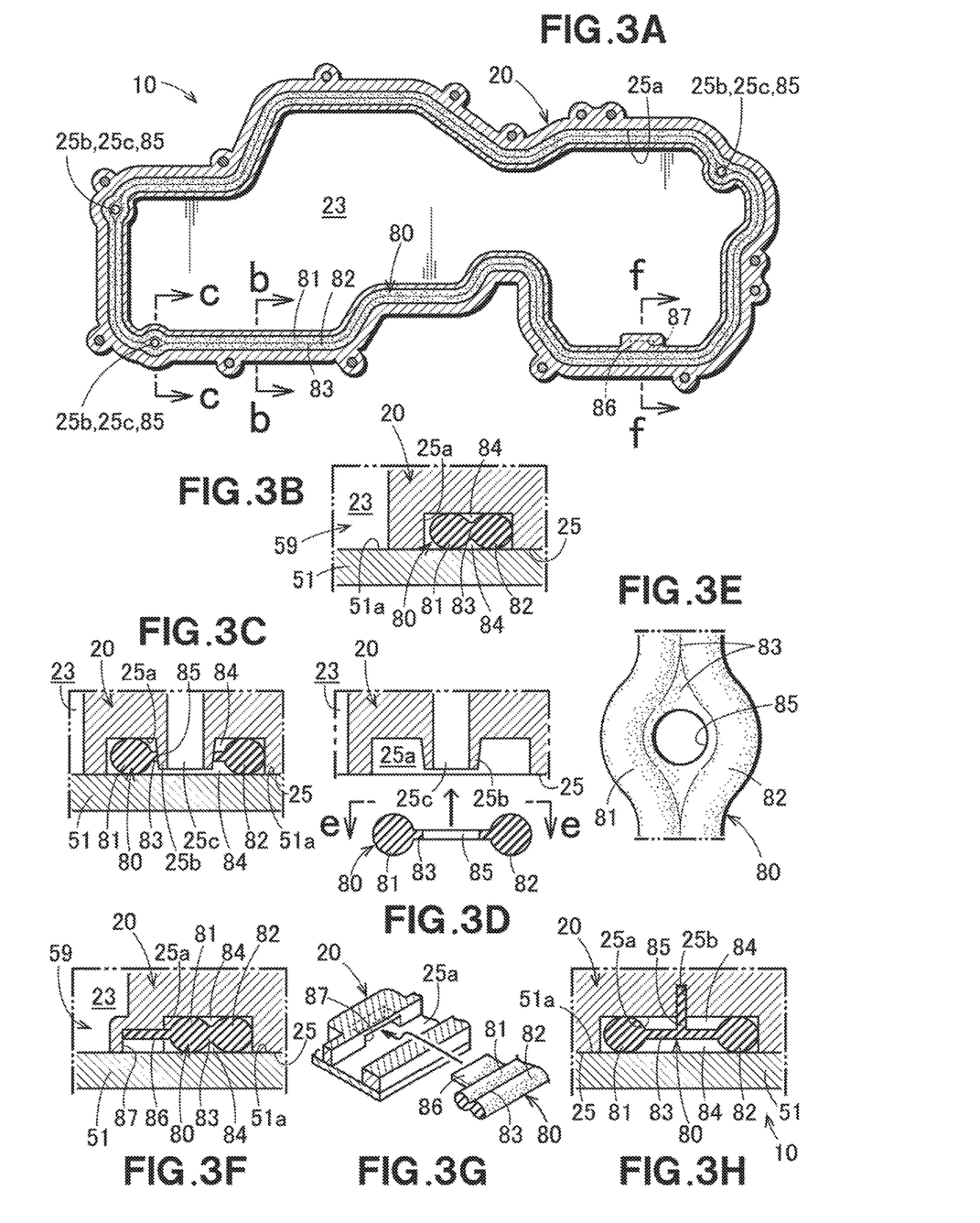
FIGS. 3A to 3H are each a diagram illustrating a sealer illustrated in FIG. 1A and a component thereof.

FIG. 3A illustrates a cross-section taken along a line 3a-3a in FIG. 1A, i.e., a structure cut along the bottom surface of the groove 25a of the casing 20, and the second sealing member 80 can be seen.

FIG. 3B illustrates a cross-section taken along a line b-b in FIG. 3A.

FIG. 3C illustrates a cross section taken along a line c-c in FIG. 3A.

FIG. 3D illustrates a structure illustrated in FIG. 3C in an exploded manner.

FIG. 3E illustrates the second sealing member 80 along a line e-e in FIG. 3D.

FIG. 3F illustrates a cross-section taken along a line f-f in FIG. 3A.

FIG. 3G illustrates a structure illustrated in FIG. 3F in an exploded manner.

The sealing surface 25 of the casing 20 has a groove 25a in a loop shape that surrounds the opening of the second space 23. The second sealing member 80 can be fitted in this groove 25a. A plurality of (e.g., three) first positioning portions 25b is provided on the bottom surface of this groove 25a.

The second sealing member 80 is formed of an elastic material like a rubber. More specifically, the second sealing member 80 is an integral mold component that includes an internal sealing portion 81, an external sealing portion 82, and a connected portion 83.

The internal sealing portion 81 is in a loop shape located along the bottom surface of the loop-shape groove 25a and the inner circumference surface thereof, and has a circular cross-section (e.g., true-circle cross-section).

The external sealing portion 82 employs a looped structure which surrounds the looped outer circumference of the internal sealing portion 81 and which is located along the bottom surface of the groove 25a, and has a circular cross-section (e.g., true-circle cross-section). That is, as illustrated in FIG. 3B, this external sealing portion 82 adjoins to the looped outer circumference surface of the internal sealing portion 81. The diameter of the circular cross-section of the external sealing portion 82 is consistent with that of the circular cross-section of the internal sealing portion 81.

The connected portion 83 integrally connects the looped outer circumference surface of the internal sealing portion 81 with the looped inner circumference surface of the external sealing portion 82 across the entire circumference of the loop. That is, the connected portion 83 is an integrated portion between the looped outer circumference surface of the internal sealing portion 81 that has a circular cross-section and the looped outer circumference surface of the external sealing portion 82 that has a circular cross-section.

Both surfaces of the connected portion 83 are recessed backwardly relative to the respective sealing surfaces of the internal sealing portion 81 and the external sealing portion 82. That is, since the looped outer circumference surface of the internal sealing portion 81 that has a circular cross-section is integrated with the looped outer circumference surface of the external sealing portion 82 that has a circular cross-section, a recess 84 (a space 84) along the loop is formed in the boundary portion between these seal portions 81 and 82. Thus, the space 84 surrounded by the internal sealing portion 81, the external sealing portion 82, and the connected portions 83 form a drain passage through which the leaked cooling medium from the internal sealing portion 81 can pass. This space 84 will be referred to as a "drain passage 84" below.

The connected portion 83 includes a plurality of second positioning portions 85 which can be respectively fitted in the plurality of first positioning portions 25b.

The plurality of first positioning portions 25b of the groove 25a is each formed by a protrusion protruding from the bottom surface of the groove 25a toward the groove opening. The first positioning portion 25b will be also referred to as a "protrusion 25b" as appropriate below. The plurality of these protrusions 25b each has a drain hole 25c capable of discharging the trapped cooling medium in the drain passage 84 to the exterior of the casing 20.

As illustrated in FIGS. 3A to 3E, such protrusion 25b and drain hole 25c are located at the center of the groove 25a in the widthwise direction so as to correspond to the location of the drain passage 84. The groove width of a portion of the groove 25a where the protrusions 25b and the drain passage 84 are located is larger than the groove widths of other portions.

Conversely, the clearance between the internal sealing portion 81 and the external sealing portion 82 is wide at the position of the second sealing member 80 corresponding to the above-described protrusions 25b. Hence, the width of the connected portion 83 is also wide. The second positioning portions 85 are each a through-hole which is located at the wide portion of the connected portion 83 and in which the corresponding protrusion 25b can be fitted. This second positioning portion 85 will be also referred to as a "through-hole 85" as appropriate.

As illustrated in FIGS. 3A, 3F, and 3G, the second sealing member 80 includes an extended portion 86 that extends outwardly from the looped inner circumference side (the inner circumference surface of the internal sealing portion 81) or from the looped outer circumference surface (the outer circumference surface of the external sealing portion 82). Either one of the casing 20 and the second cooling unit 59 (the cooler 12) includes a recess 87 in which the extended portion 86 can be fitted.

FIG. 3H illustrates a modified example of the structure illustrated in FIG. 3C. According to this modified example, the first positioning portions 25b provided at the bottom surface of the groove 25a are each formed as a recess, and the second positioning portions 85 of the connected portion 83 of the sealing member 80 are each formed as a protrusion. The second positioning portions 85 can be fitted in the respective first positioning portions 25b.

As illustrated in FIG. 1A to FIGS. 3H, a space between the two drain holes 24c and the two drain holes 25c are in communication with each other by the two drain guide paths 91, respectively. Such drain guide paths 91 run through the interior of the casing 20 (e.g., formed inside the casing 20). These drain guide paths 91 can guide the leaked cooling medium from between the casing 20 and the first cooling unit 30 to the respective drain holes 25c. The two drain holes 25c can cause the cooling medium guided from the respective drain guide paths 91 to flow into the drain passage 84 of the sealing member 80 for the second cooling unit.

As illustrated in FIGS. 1A, 2A and 2B, the remaining drain hole among the three drain holes 25c is in communication with a drain discharging port 92. This drain discharging port 92 is provided in the casing 20, and discharges the leaked cooling medium to the exterior. That is, the plurality of grooves 24a, 24a, 25a, and 25a is merged into the single drain discharging port 92.

The drain discharging port 92 includes a first vertical passage 92a that extended upwardly from the one drain hole 25c, a horizontal passage 92b that extends substantially horizontally from the upper end of this first vertical passage 92a, and a second vertical passage 92c which extends downwardly from the tip of the horizontal passage 92b and which is opened to the exterior. The leaked cooling medium can be discharged from the second vertical passage 92c to the exterior.

Modified Example

A power converter 10A according to a modified example will be described with reference to FIGS. 4A and 4B.

Figure 4A:
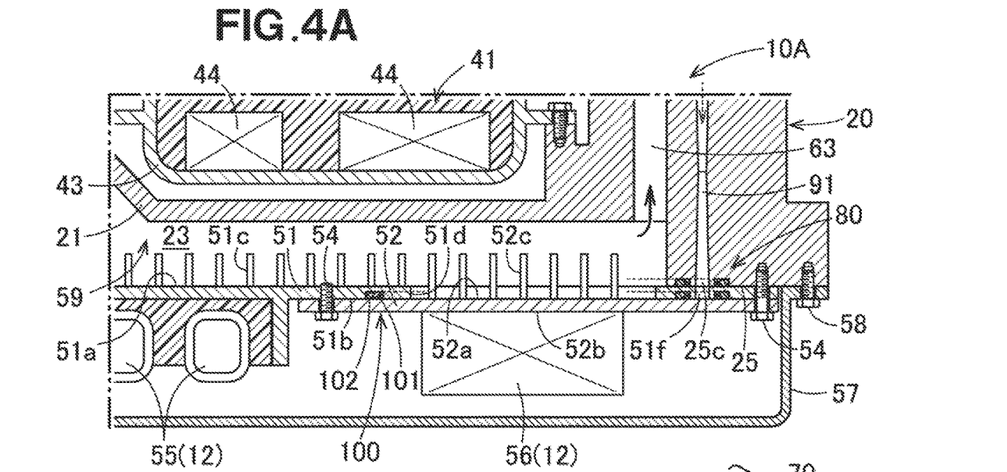
FIGS. 4A and 4B are a partial cross-sectional view of a modified example of the power converter illustrated in FIG. 1A, and a perspective view around the plurality of sealers.

FIG. 4A is a partial cross-sectional view of the major portion of the power converter 10A according to the modified example, and the illustration corresponds to FIG. 1A.

Figure 4B:
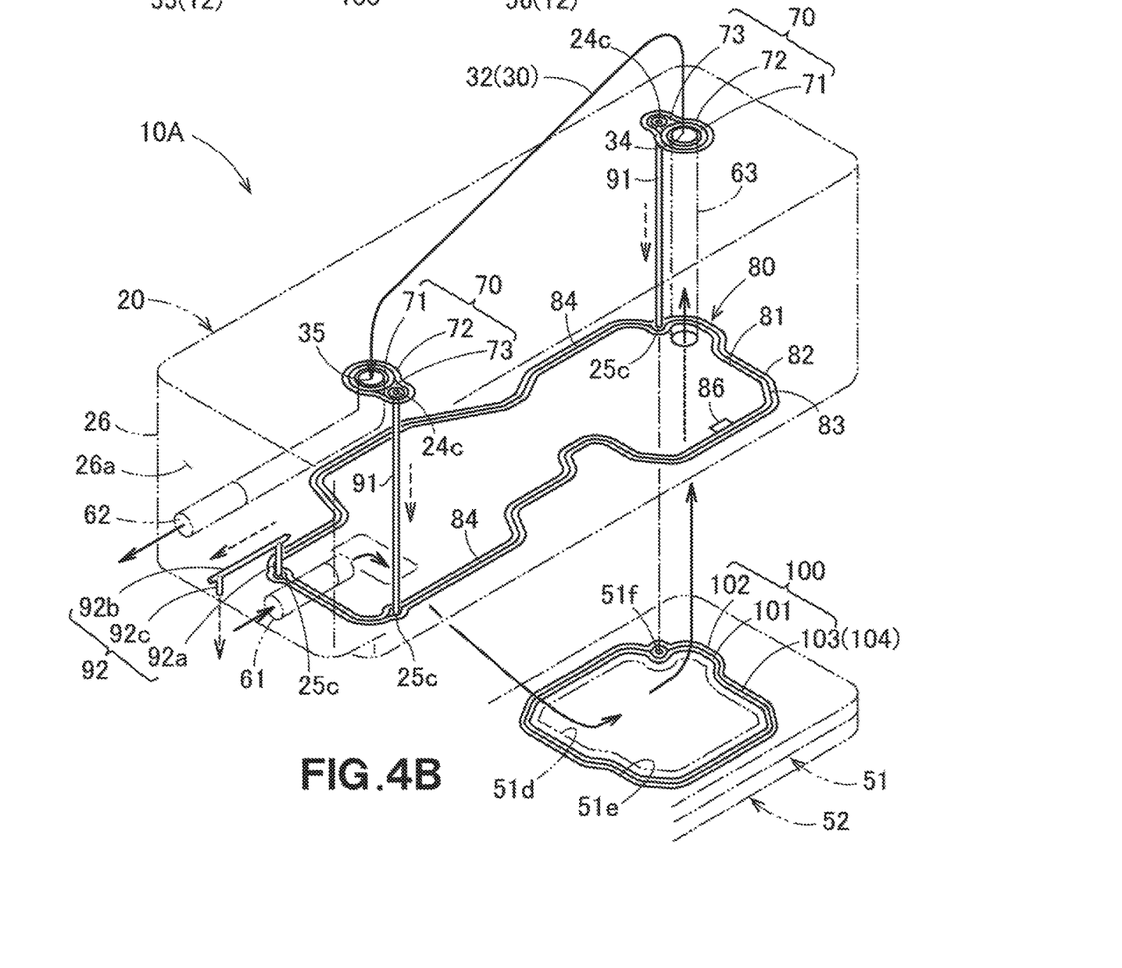

FIG. 4B is a perspective view around the sealing portion of the power converter 10A according to the modified example, and the illustration corresponds to FIG. 2B.

According to the power converter 10A of the modified example, the lid 51 has a through-hole 51d that is blocked by a lid 52 (the other lid 52) formed of the different component. The other components are the same as those of the embodiment illustrated in FIGS. 1A to 3H, and thus the same reference numerals will be given to those components and the detailed description thereof will be omitted The second electronic components 56 (the other electronic components 56) are mounted on the other lid 52. More specifically, the other lid 52 is a flat plate which is laid over on the mount surface 51b of the lid 51 so as to block the through-hole 51d of the lid 51 and which is freely detachably attached thereto by bolts 54. The other lid 52 has a surface facing the mount surface 51b of the lid 51 as a sealing surface 52a, and has a surface at the opposite side to sealing surface 52a as the mount surface 52b. Formed on the sealing surface 52a is a plurality of cooling fins 52c that extends into the second space 23. The second electronic components 56 are mounted on the mount surface 52b of the other lid 52.

The space between the mount surface 51b of the lid 51 and the seal surface 52a of the other lid 52 is sealed by a third sealing member 100. The mount surface 51b of the lid 51 has a groove 51e in a loop shape that surrounds the through-hole 51d. The third sealing member 100 can be fitted in this groove 51e. A drain hole 51f is formed in the bottom surface of this groove 51e.

The third sealing member 100 has the substantially same structure as that of the second sealing member 80, and is an integral mold component that includes an internal sealing portion 101 with a circular cross-section which is located along the bottom surface of the groove 51e, an external sealing portion 102 with a circular cross-section located so as to surround the looped outer circumference surface of the internal sealing portion 101, and a connected portion 103 that integrates the internal sealing portion 101 with the external sealing portion 102 across the entire circumference of the loop.

Since the fitting structure of the third sealing member 100 to the groove 51e is the same as that of the embodiment illustrated in FIGS. 3B to 3E, the description will be omitted. The drain hole 51f is in communication with the drain hole 25c of the casing 20.

The foregoing description will be summarized as follows.

The sealing members 70, 80 and 100 have respective structures which integrate the respective internal sealing portions 71, 81 and 101 that have a circular cross-section with the respective external sealing portions 72, 82 and 102 that have a circular cross-section across the entire circumference of a loop by the respective connected portions 73, 83 and 103. That is, the sealing members 70, 80 and 100 are each formed of a single member. These single sealing members 70, 80 and 100 can be fitted in the respective single grooves 24a, 25a, and 51e in a loop shape.

As illustrated in, for example, FIG. 1A and FIG. 3B, it is assumed that the pressure of the cooling medium is applied to the internal sealing portion 81 from the interior (the second space 23) of the second cooling unit 59. The pressure of this cooling medium acts on the side surface of the groove 25a via the connected portion 83 and the external sealing portion 82 from the internal sealing portion 81. That is, the pressure of the cooling medium can be caught by entire the second sealing member 80. Therefore, it is unnecessary to divide the groove 25a into a groove for the internal sealing portion 81 and a groove for the external sealing portion 82, but the groove 25a can be a single groove.

The same is true of the groove 24a illustrated in FIG. 1B to FIG. 1D, and the groove 51e illustrated in FIG. 4B.

As is clear from the foregoing description, unlike the conventional technologies, it is necessary to provide a plurality of grooves in the respective sealing surfaces 30a, 51a, and 52a of the cooling units 30 and 59 and in the respective sealing surfaces 24 and 25 of the casing 20. What is necessary is to provide a relatively small sealing space for the sealing surfaces 24, 25, 30a, 51a, and 52a, and thus the casing 20 and the cooling units 30 and 59 can be downsized. Consequently, downsizing the power converters 10 and 10A can be achieved.

Moreover, the first positioning portions 24b and 25b are formed on the bottom surfaces of the grooves 24a and 25a of the casing 20, and the second positioning portions 75 and 85 are provided on the connected portions 73 and 83. Accordingly, by fitting the first positioning portions 24b and 25b in the second positioning portions 75 and 85, the sealing members 70 and 80 can be easily positioned relative to the grooves 24a and 25a. Hence, the assemble easiness of the sealing members 70 and 80 to the grooves 24a and 25a is improved, decreasing the number of steps of assembling. This is particularly effective when the respective sealing member 70 and 80 that have a complex loop shape and are large are applied.

Furthermore, since the internal sealing portions 71, 81 and 101 and the external sealing portions 72, 82 and 102 all have a circular cross-section, when the sealing surfaces 24 and 30a, the sealing surfaces 25 and 51a, and the sealing surface 51b and 52a are butted with each other and compressed, an inclination or a fall-over do not occur. This ensures the stable sealing performance of the sealing members 70, 80 and 100.

Still further, the spaces 74, 84 and 104 surrounded by the respective internal sealing portions 71 81 and 101, the respective external sealing portions 72, 82 and 102 and the respective connected portions 73, 83 and 103 can be utilized as the respective drain passages 74, 84 and 104. Hence, it is unnecessary to provide individual drain passages in the sealing surfaces 30a, 51a, and 52a of the cooling units 30 and 59, and the sealing surfaces 24 and 25 of the casing 20. This enables a further downsizing of the casing 20 and the cooling units 30 and 59. Moreover, a component for providing an individual drain passage is unnecessary, reducing the costs for the power converters 10 and 10A.

Yet still further, the first positioning portions 24b and 25b formed by the protrusions 24b and 25b protruding from the bottom surface of the grooves 24a and 25a, and the second positioning portions 75 and 85 formed by the through-holes 75 and 85 in which the respective protrusions 24b and 25b can be fitted facilitate the positioning of the sealing members 70 and 80 relative to the grooves 24a and 25a. Moreover, the protrusions 24b and 25b are provided with the respective drain holes 24c and 25c capable of discharging the trapped cooling medium in the drain passages 74 and 84 to the exterior of the casing 20. That is, an additional drain hole is unnecessary since the protrusions 24b and 25b have the respective drain holes 24c and 25c. Consequently, downsizing of the power converters 10 and 10A is achieved, while at the same time, reduction of the costs for the power converters 10 and 10A is also achieved.

Moreover, when the extended portion 86 of the sealing member 80 is combined with the recess 87 in which this extended portion 86 can be fitted, the fitting direction of the sealing member 80 in the groove 25a is defined. This prevents assembling of the sealing member 80 in the groove 25a in an improper direction, i.e., a false assembling. Hence, the attachment easiness of the sealing member 80 to the groove 25a improves. Moreover, the sealing member 80 can be more precisely positioned to the groove 25a.

Furthermore, the cooling units 30 and 59 are at least partially formed integrally with the casing 20. That is, by utilizing the space in the casing 20, the casing 20 serves as at least a part of the cooling units 30 and 59. This makes it possible for the power converters 10 and 10A to have a simple structure, achieving a further downsizing of the power converters 10 and 10A.

According to the present disclosure, the power converters 10 and 10A are applicable to, in addition to electric vehicles and so-called hybrid vehicles, ships and general industrial applications.

Moreover, the grooves 24a and 25a in a loop shape in which the respective sealing members 70 and 80 can be fitted may be provided in either the sealing surfaces 30a and 51a of the cooling units 30 and 59 or the sealing surfaces 24 and 25 of the casing 20.

Furthermore, the first cover 45 and the second cover 57 illustrated in FIGS. 1A to 1H are optional.

INDUSTRIAL APPLICABILITY

The present disclosure is suitable for a power converter loaded on vehicles.

What is claimed is:

1. A power converter comprising:
   a cooler that cools down an electronic component;
   a casing comprising the cooler; and
   a sealing member in a loop shape sealing a space between a sealing surface of the cooler and a sealing surface of the casing, wherein:
   either one of the sealing surface of the cooler and the sealing surface of the casing is provided with a groove in a loop shape enabling the sealing member to be fitted therein;
   a first positioning portion is provided on a bottom surface of the groove;
   the sealing member comprises an internal sealing portion with a circular cross-section and located along the bottom surface of the groove, an external sealing portion with a circular cross-section and located so as to surround a looped outer circumference surface of the internal sealing portion, and a connected portion that connects the internal sealing portion to the external sealing portion across an entire circumference of the loop; and the connected portion comprises a second positioning portion capable of being fitted in the first positioning portion.

2. The power converter according to claim 1, wherein:

both surfaces of the connected portion are recessed backwardly relative to the respective sealing surfaces of the internal sealing portion and the external sealing portion; and a space surrounded by the internal sealing portion, the external sealing portion, and the connected portion forms a drain passage enabling a leaked cooling medium from the internal sealing portion to pass therethrough.

3. The power converter according to claim 2, wherein:

the first positioning portion comprises a protrusion protruding from the bottom surface of the groove toward an opening of the groove;

the protrusion has a drain hole capable of discharging the cooling medium trapped in the drain passage to an exterior of the casing; and the second positioning portion is a through-hole enabling the protrusion to be fitted therein.

4. The power converter according to claim 2, wherein:

the electronic component comprises a power module, and other electronic components that have a little amount of heat generation than the power module;

the cooler comprises a first cooling unit that cools down the power module and a second cooling unit that cools down the other electronic components;

a drain guide path runs through an interior of the casing, the drain guide path guiding a leaked cooling medium from between the first cooling unit and the casing;

the sealing member comprises a second cooling unit sealing member that seals a space between a sealing surface of the second cooling unit and a sealing surface of the casing;

the groove comprises a second cooling unit groove enabling the second cooling unit sealing member to be fitted therein;

the first positioning portion comprises a protrusion protruding from a bottom surface of the second cooling unit groove toward an opening of the groove;

the protrusion has a drain hole enabling the cooling medium guided from the drain guide path to flow in the drain passage of the second cooling unit sealing member; and the second positioning portion is a through-hole enabling the protrusion to be fitted therein.

5. The power converter according to claim 1, wherein:

the sealing member in the loop shape comprises an extended portion extended outwardly from an outer circumference surface of the loop or an inner circumference surface thereof; and either one of the cooler and the casing has a recess enabling the extended portion to be fitted therein.

6. The power converter according to claim 1, wherein at least a part of the cooler is integrally formed with the casing.

* * * * *